US006860363B2

(12) United States Patent
Gardner et al.

(10) Patent No.: US 6,860,363 B2
(45) Date of Patent: Mar. 1, 2005

(54) PLANAR ACOUSTIC WAVEGUIDE

(76) Inventors: Christopher Gardner, 434 Brockway Rd., Hopkinton, NH (US) 03229; Christopher Huston, 632 McKays Ct., Brentwood, TN (US) 37027

( * ) Notice: Subject to any disclaimer, the term of this patent is extended or adjusted under 35 U.S.C. 154(b) by 0 days.

(21) Appl. No.: 10/190,447

(22) Filed: Jul. 3, 2002

(65) Prior Publication Data

US 2004/0003962 A1 Jan. 8, 2004

(51) Int. Cl.[7] ........................... H05K 5/00; G10K 11/00
(52) U.S. Cl. ........................ 181/155; 181/191; 381/160
(58) Field of Search ................................ 181/198, 199, 181/191, 155, 153, 156; 381/335, 349, 160

(56) References Cited

U.S. PATENT DOCUMENTS 3,666,041 A * 5/1972 Engelhardt .................. 181/145
3,730,291 A * 5/1973 Goeckel ..................... 181/193
4,289,929 A * 9/1981 Hathaway ................... 381/351
4,433,749 A * 2/1984 Watkins et al. ............. 181/199
5,012,889 A * 5/1991 Rodgers ..................... 181/199
5,284,222 A * 2/1994 Ito ............................. 181/199
5,367,576 A * 11/1994 Matsumoto et al. ......... 381/341
6,122,386 A * 9/2000 Wiley ......................... 381/160
6,571,909 B1 * 6/2003 Olinger ...................... 181/199

FOREIGN PATENT DOCUMENTS

JP 62128699 A * 6/1987 ............ H04R/1/02
JP 11234778 A * 8/1999 ............ H04R/1/26
JP 2000308169 A * 11/2000 ............ H04R/1/02

* cited by examiner

*Primary Examiner*—David Martin
*Assistant Examiner*—Eduardo Colon Santana

(57) ABSTRACT

An improved speaker enclosure system and method is described which includes extending the existing baffle of a speaker enclosure on either side. Ideally, the ratio of the height of the baffle should be 1.4 times the internal depth of the enclosure, and the width of the baffle and baffle extensions should be 1.6 times the internal depth. These ratios change for different driver configurations. The result is improved dispersion angle and perceived dimensionality of the sound produced.

13 Claims, 5 Drawing Sheets

PLANAR ACOUSTIC WAVEGUIDE

TECHNICAL FIELD

The present invention relates to sound reproduction systems and more particularly, relates to loudspeaker enclosures.

BACKGROUND INFORMATION

A goal with speaker systems is to faithfully reproduce a sound. This sound may be from a recording, or directly from a real-time audio source, such as a microphone. A simple speaker (also referred to as a driver) hanging in free air is a poor reproducer of sound—sound waves from the back side of the speaker interfere with the waves coming forward. Each speaker has frequency response characteristics which make it good in one frequency range and poor in another. For example, a twelve inch woofer is designed to be able to reproduce low frequency sounds well, but the speaker cone has such large mass that it does a relatively poor job of reproducing higher frequencies.

One technique of improving the sound from a speaker is well known in the art: eliminating the sound waves from the rear of the speaker cone by putting the speaker into a wall. The wall serves as a baffle preventing the sound waves from the backside from emerging and interfering with the sound weaves coming off the front of the speaker. That not always being convenient, it was found that putting a speaker into a sealed box had the same effect, hence a sealed box speaker also being referred to as an infinite baffle enclosure. A variety of configurations have emerged for speaker enclosures of this type.

Another technique developed of combining two or more speakers in a single enclosure, or in separate enclosures but reproducing essentially the same sound source. For example, a large cone speaker (woofer) might be combined with a smaller hard cone high frequency speaker (tweeter) to get better overall sound coverage. It was quickly noted that putting low frequencies into the tweeter resulted in poor sound reproduction, and so the frequencies were split using various designs of crossover networks to shunt higher frequencies to the tweeter and lower frequencies to the woofer. A variety of passive and active crossover networks are well known in the art.

Yet another improvement can be obtained by putting a vent in the front of the speaker enclosure. By properly sizing the vent and enclosure, the frequency response in the low range of a woofer can be improve substantially over an un-vented enclosure, generally obtaining a one octave improvement. This results in flat frequency response curve over a broader and lower frequency range than a closed box will provide, in effect providing a resonant chamber to assist the speaker in producing low frequency sound. While the roll-off rate at the low end of the frequency response is sharper, it occurs at a lower frequency.

Choosing port dimensions was, until the 1970s, a trial-and-error affair. Neville Thiele and Richard Small devised an analysis method that could predict the frequency response performance, and other characteristics of a loudspeaker system and enclosure, based on the physical and electronic properties of the devices used and the enclosure designed. Most loudspeaker manufacturers now provide these characteristics as part of the speaker specifications known as Thiele-Small parameters from which ideal (i.e. getting the best desired performance) enclosures for that device may be designed and built. Of course, any design ends up being something of a compromise between optimum sound reproduction and the practical physical size limitations of an enclosure. Often, quality is sacrificed for reduced size.

Because speaker enclosures have in recent times been designed using the Thiele-Small parameters, the resultant enclosure has a predictable internal volume, relative to the size and desired performance of the selected drivers. There is typically a box with a top, bottom, sides (which need not be parallel), front and back. (In terms of the physics of the enclosure, it makes no difference which is considered the front, back, sides or top. This is because it is primarily the volume of air in the box that is most important to the functioning of the box and drivers. It is usual to choose the largest physical surface as the front, or baffle.)

The front baffle of any speaker enclosure is equally, if not sometimes more, important that the enclosure. This is because the speaker (or driver) which is required to produce the low frequency components of the sound source is typically mounted directly on the baffle.

In many cases, the low frequency driver is placed on a surface (the front baffle) of inadequate physical area to propagate the low frequency sound waves to their full potential. Instead, the designers go to great lengths to manipulate the enclosure/port dimensions and the electronic crossover network to achieve the best (i.e. desired compromise) and most appropriate acoustic performance for the selected drivers. In many cases, certain performance results are achieved at the expense of others.

The best speaker systems still have a limited dispersion angle left and right of center in front of the speaker angle at which a constant sound pressure level is produced, ideally the same for the desired range of frequencies to be reproduced. If a listener is too far off axis, the sound was not satisfactory, thus placing limitations on where in a room speakers could be placed and where the listener should be relative to the speakers in order to achieve maximum fidelity.

A room can have substantial effects on the reproduction of sound, depending on the number and position of reflecting surfaces and diffracting edges that can interfere with the sound as initially produced at the speaker cone.)

Another perceived deficiency of many speaker systems is harder to articulate or quantify, but nevertheless quite real. It is best described as the "lack of dimensionality" of the sound produced. Simply put, some speaker systems seem to give a greater impression of the sound space in which the sound being reproduced was generated. The sound produced seems subjectively more three-dimensional, although this effect often is experienced only in certain spots in front of a particular speaker system.

SUMMARY

In one embodiment, the present invention relates to a system, method and article of manufacture having a speaker enclosure with a front baffle, the sides of which are extended outwardly and co-planarly with the baffle. In another embodiment, the enclosure is vented. The baffle extensions may be rectangular and extend from the sides of the enclosure. All or portions of the baffle extension may be curved generally toward the back of the enclosure.

In yet another embodiment, the ratio of the height of the baffle extensions to the interior depth of the enclosure is between 1.2 and 1.5 and the width of the baffle extension and baffle is between 1.3 and 1.8 times the interior depth.

In an embodiment having a D'Appolito configuration, the ratio of height to depth is 1.333 In an embodiment having more than two speakers (other than the D'Appolito configuration) the ratio of height to depth is 1.5

BRIEF DESCRIPTION OF THE DRAWINGS

These and other features and advantages of the present invention will be better understood by reading the following detailed description, taken together with the drawings wherein.

DETAILED DESCRIPTION OF THE INVENTION

Figure 1:
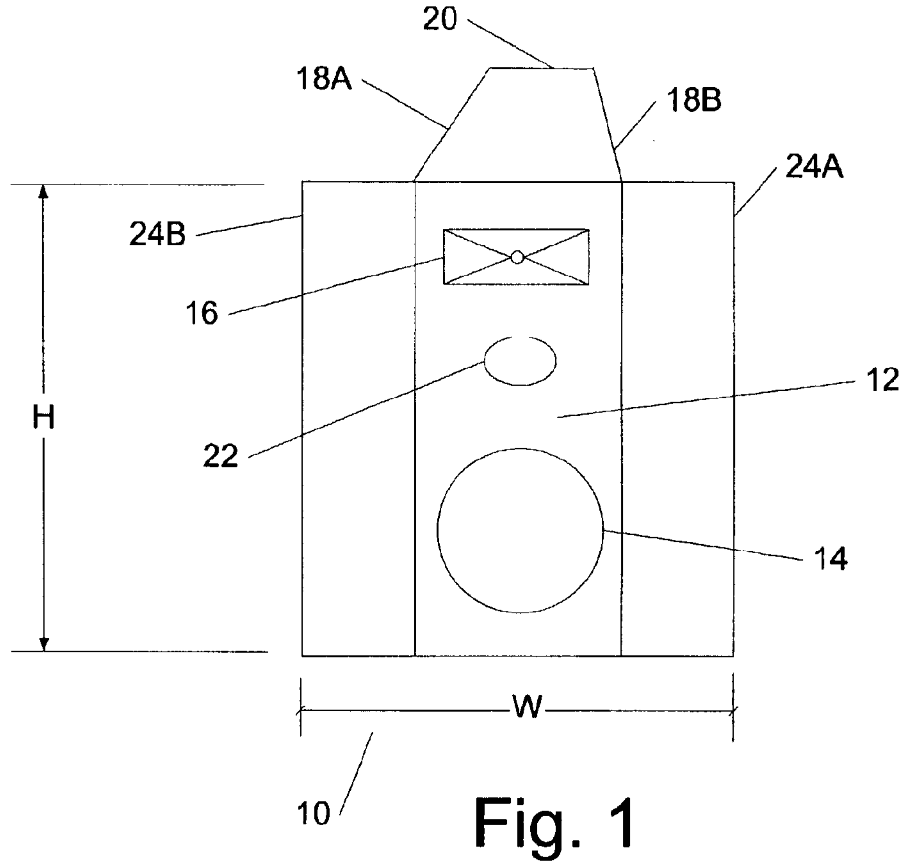
FIG. 1 is a front view of a typical enclosure according to the principles of the present invention.

The front baffle of any speaker enclosure is equally, if not sometimes more, important that the enclosure. This is because the speaker (or driver) that is required to produce the low frequency components of the sound source is typically mounted directly on the baffle.

The present invention promotes low/mid frequency sound wave propagation. By extending the front baffle beyond the physical dimensions of the speaker enclosure behind it, the surface area of the baffle is increased, which dramatically increases the enclosed drivers' performance and perceived dimensionality of the sound produced. These baffle extension are, in one embodiment, attached to, and extend out from the sides of the speaker enclosure and are co-planar with the baffle forming the front of the enclosure.

The baffle extensions can be either at the sides or, if necessary, the top and bottom of the enclosure. (The top and bottom can be considered the sides, if the box is rotated through ninety degrees.) The present invention provides a large, dense and inflexible surface immediately adjacent to the drivers, which allows for dramatically improved waveform propagation and imaging in the lower/mid frequencies.

Existing speaker systems may beneficially be retrofitted with baffle extensions according to the principles of the present invention. Ideally, the baffle extensions and the front surface of the baffle should be as co-planar as practical, and the interface between the baffle and baffle extensions should provide no diffracting edges.

Optimum performance in the general case results from a height to depth ration of 1.4 and a width to depth ration of 1.6. (Here, the width refers to the combined with of the baffle extension(s) and the baffle). Thus, in a typical vented two driver enclosure, the baffle extensions together with the baffle are ideally of width 1.6 times the internal depth of the enclosure, and the height is 1.4 times the internal depth.

In a D'Appolito configuration (having two woofers disposed below and above a tweeter) the optimum height to depth ratio is 1.333. The width to depth ration remains optimally at 1.6.

As more drivers are added, the ideal width to depth ratio settles at 1.5, with the height to depth settling at 1.4. In enclosures with more than three drivers, optimum performance is obtained with the width of the baffle extensions (one on each side of the enclosure) and baffle being 1.5 times the internal depth of the enclosure. While larger baffles may be used beneficially, no increased or improved performance has been noted when doing so.

Ideally, these 'extensions' are not separate from, and/or added to, the enclosure front. Rather, the entire baffle is constructed as one piece and mounted on the enclosure to form a 'front' that extends out beyond the sides. This not being possible in a retrofit of an existing speaker enclosure, care should be taken to minimize any diffracting edges at the boundary between the existing baffle and the baffle extensions.

The baffle extensions are ideally of the same material as the baffle itself (indeed, ideally should be the same piece) which should be a hard sound-reflective material. Some reduction in diffraction at the edges may be obtained by putting a diffraction reducing material at the edges (such as foam rubber or other materials well known in the art). The surface of the baffle extensions may be curved at the extreme left and right edges, so as to minimize the diffracting effects of the edge.

The benefits of the present invention have far-reaching uses and potential. For instance, one of the compromises of conventional enclosure design is the harnessing of low frequency performance of the speaker/enclosure combination with the least loss of electro-acoustic efficiency. This loss of efficiency can manifest itself in several ways, one of which can be the compromise in the overall ratio of acoustic output relative to the power of the amplifier driving the speaker system. This is usually, due to the backpressure of the air momentarily trapped in the box (enclosure) which restricts the backwards movement of the speaker. The ratio of the port to the box dimensions are responsible for this condition and as the ratios are interchanged there are predictable response curves for the box resonant frequency, the speaker efficiency, the low attainable frequency et cetera.

Those skilled in the art will readily appreciate that the ratios for the height and depth called for may require a change in the vent solution as normally obtained from the Thiel Small parameters. So far, no empirical formula has been determined for the vent solution when implementing an enclosure according to the principles of the present invention. What has been discovered, however, is that frequently, the vent solution provided by Thiel Small is not optimum. So far, experimentation and trial and error have produced optimum vent solutions.

Looking now at FIG. 1, a typical enclosure 10 according to the principles of the present invention is shown. A conventional enclosure consisting of a front baffle 12, a woofer 14, a tweeter 16 and a vent 22 is shown. The enclosure has two sides 18*a* and 18*b*, as well as a back 20. Two extended baffles 24*a* and 24*b* extend co-planar with the baffle 12 from either side of the enclosure 10. The height H of the enclosure with this configuration of drivers is preferably 1.4 times the internal depth of the enclosure (D in FIG. 2) while the width W will depend upon the specific configuration, as discussed above.

Figure 2:
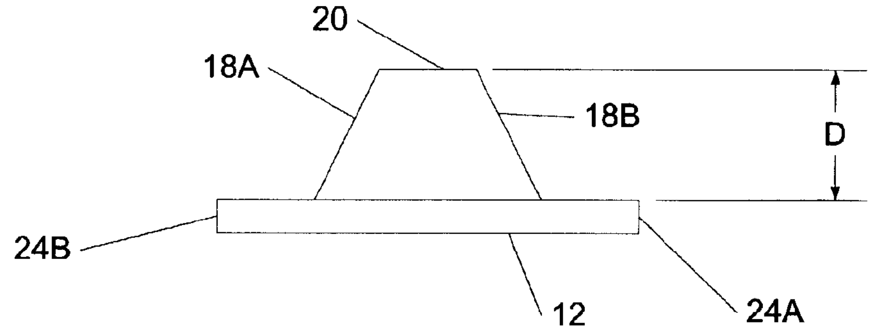
FIG. 2 is a top view of a typical enclosure according to the principles of the present invention.

FIG. 2 shows a top view of a typical enclosure according to the principles of the present invention. In this implementation, the sides 18*a* and 18*b* are not parallel planes, but this is not a feature of the present invention. The internal depth of the enclosure is designated D.

Figure 3:
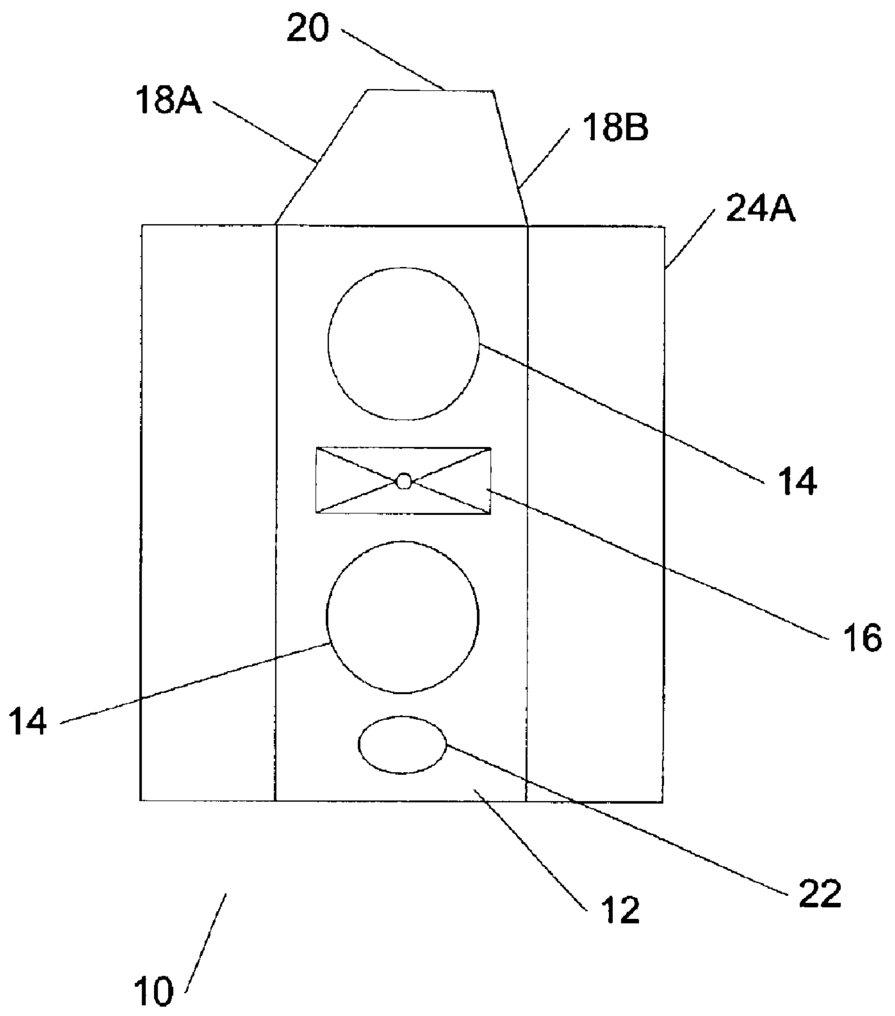
FIG. 3 is a D'Appolito configuration enclosure according to the principles of the present invention.

Referring to FIG. 3, a typical D'Appolito enclosure is shown. In this case there are two woofers 14 disposed above and below a tweeter 16. As discussed above, in this configuration it has been found that the baffle extensions are optimized if their width is 1.333 times the internal depth of the enclosure.

Figure 4A:
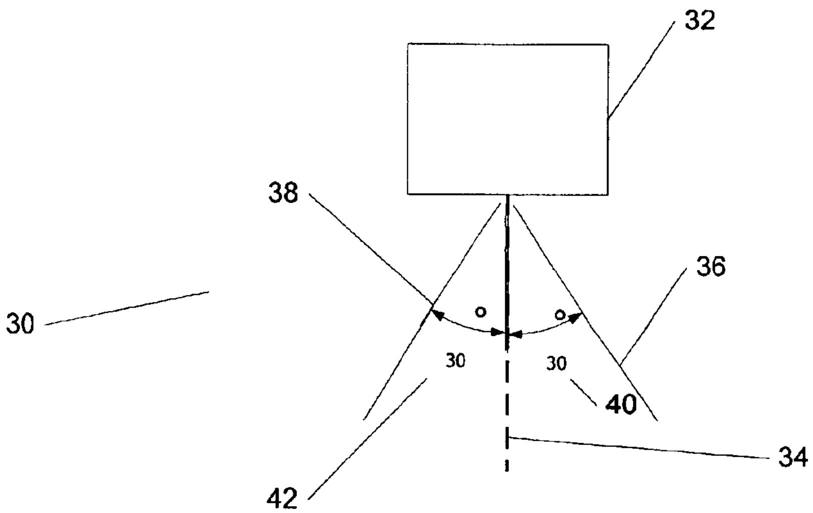
FIGS. 4*a* and 4*b* are diagrams of speaker dispersion angles without and with the features of the present invention.

One advantage of the present invention is increased horizontal dispersion. FIG. 4A shows a diagram 30 of a typical speaker enclosure 32 having a center line 34 and two side lines of equal sound pressure level on either side of the center line 36 and 38. These side lines each form an angle of 30 degrees 40,42 from the center line 34, for a total of sixty degrees dispersion angle. What is meant is that within thirty degrees of either side of the center line, the sound should appear to be about the same, and fall off rapidly outside of the dispersion angle.

Figure 4B:
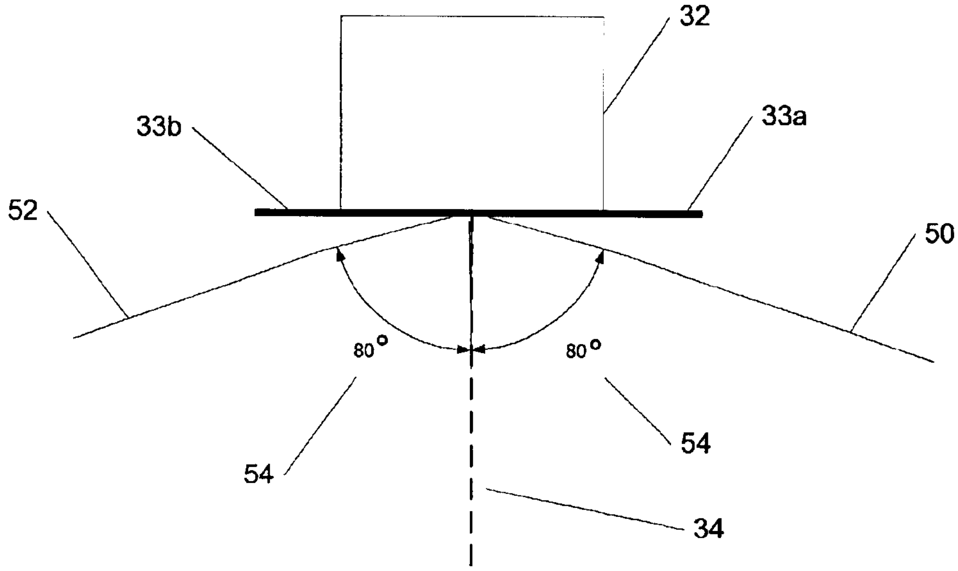

FIG. 4B shows a typical dispersion angle formed when using the present invention together with the same speaker enclosure 32 as shown in FIG. 4A. In this example, by adding baffle extensions (or "wings") 33*a*, 33*b* to the enclosure 32 the dispersion angles 50 and 52 of egual sound pressure level to either side of the center line 34 are 80 degrees 54, for a total dispersion angle of 160 degrees. This means that the placement of enclosed speakers built according to the principles of the present invention is far less critical for good performance.

In tests, a single speaker with an enclosure according to the principles of the present invention was driven with pink noise over 20 Hz to 20 KHz. The measured results are shown in Table 1.

TABLE 1

| Angle off Center Line (Degrees) | Sound Pressure Level Reading dB |
|---|---|
| −80 | 89 |
| −60 | 89 |
| −30 | 89 |
| 0 | 90 |
| 30 | 90 |
| 60 | 90 |
| 80 | 89 |

It should be noted too that, unlike conventional speaker enclosures, optimum performance is obtained by having the two speakers pointing parallel to one another, not angled inwardly as is typically done with conventional enclosures.

Figure 5:
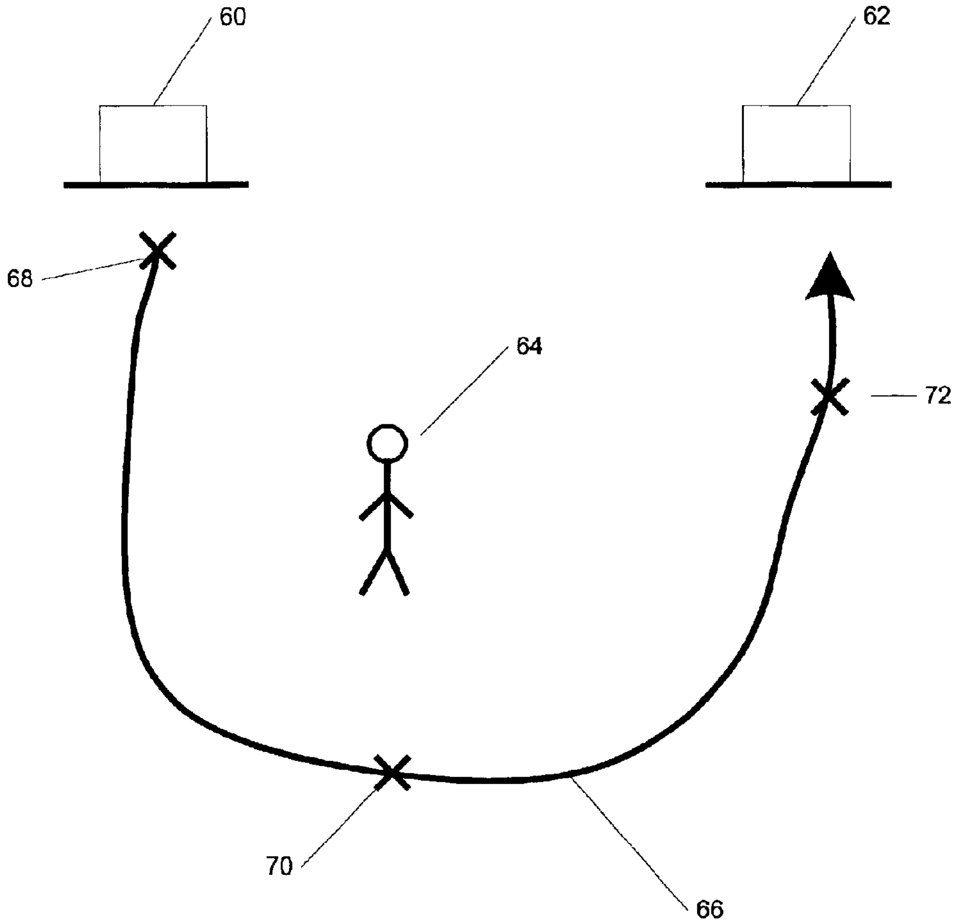
FIG. 5 is a diagram of the perceived path of a sound produced by a pair of speakers enclosed in accordance with the principles of the present invention.

While difficult to quantify, one notable advantage of the present invention is to substantially improve the perceived dimensionality of the sound produced. By dimensionality it is meant that in an A/B comparison, adding the features of the present invention makes the sound appear to be more three-dimensional. Indeed, as shown in FIG. 5, two speakers 60 and 62, playing a conventionally recorded compact disk recording, produced an apparent movement for a listener 64 of a sound from speaker 60 along a path 66 which started at point 68. The sound appeared to move along the path 66 to a point 70 behind the listener 64, then continue on to in front and to the right of the listener 64 to point 72. It should be noted that there were no other speakers other than as shown, and that this effect was reproducible at a variety of positions of the listener 64.

Figure 6:
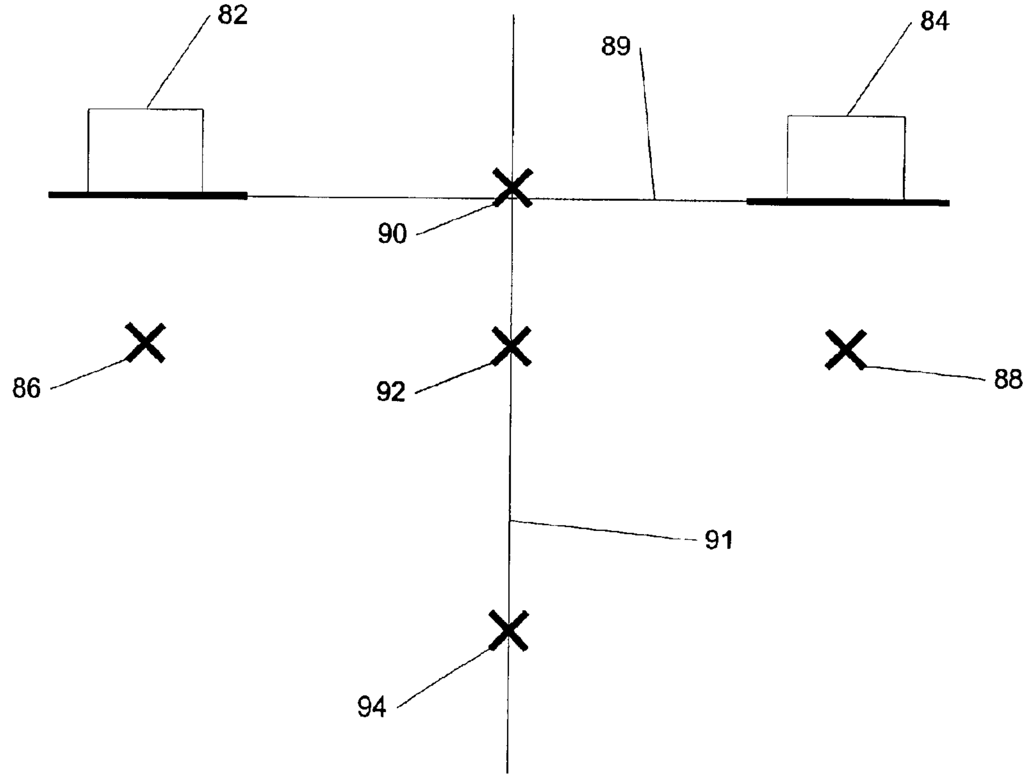
FIG. 6 is a diagram of positions of sound pressure level (SPL) measurements relative to two speaker enclosures built according to the principles of the present invention

Referring to FIG. 6, a typical arrangement of speakers and enclosures 80 according to the principles of the present invention is shown. Two speakers 82 and 84 are arranged to be coplanar along a line 89 and driven with pink noise from 20 Hz to 20 KHz.

At a point 86, 88 1 meter in front of each speaker a reference level was measured at 90 dB. At a point 90 n the plane of the two speakers 89 and equidistant between them on a centerline 91, the SPL measured 86 db, not unexpectedly. At a point 92 one meter in front of each speaker and on the centerline 91 between the two speakers the SPL was measured to be 90 dB. At a point 94 further away but still on the centerline 91, the SPL was measured to be 92 dB. The exact location of this point of increased SPL varied with different speakers.

The increased SPL appears to be the result of coincidental reinforcement. The result is a phantom sound image, which can appear to be behind a listener.

Modifications and substitutions by one of ordinary skill in the art are considered to be within the scope of the present invention, which is not to be limited except by the following claims.

The invention claimed is:

1. A speaker enclosure comprising, a first side and a second side, a back, an internal depth and a height, and at least one driver mounted on a baffle having a top and a bottom and which forms the front surface of the enclosure and which is joined at an angle to the first side and the second side of the enclosure;

further comprising at least one baffle extension comprising at least one acoustically reflective surface substantially co-planar with the front surface of the baffle, and which baffle extenson extends outwardly from at least one side of the baffle;

wherein said speaker enclosure has one driver selected from the group consisting of two drivers, and in which a baffle height is 1.4 times the depth and the baffle and baffle extension together have a combined width which is at least 1.6 times the depth.

2. The speaker enclosure of claim 1 in which the height is between 1.2 and 1.5 times the depth.

3. The speaker enclosure of claim 1 in which the width of the baffle and baffle extensions together are between 1.4 and 1.8 times the depth.

4. The speaker enclosure of claim 1 in which the at least one driver comprises two woofers and one tweeter, and in which the height is 1.333 times the depth and the width of the baffle extensions together with the baffle is 1.5 times the depth.

5. The speaker enclosure of claim 1 having at least three drivers, and in which the baffle and baffle extensions together have a combined width of 1.5 times the depth.

6. A method of improving the sound quality from a speaker comprising the steps of:

providing at least one driver selected from the group consisting of two drivers, mounted on and approximately co-planar with a baffle which baffle forms a front of a speaker enclosure having left side, a right side and an internal depth;

providing at least one acoustically reflective baffle extension co-planar with the baffle and extending one side of the baffle beyond at least one of the left side and right side, a distance forming together with the baffle, a front width;

in which a baffle height is 1.4 times the depth, and the at least one baffle extension and baffle together have a combined width which is at least 1.6 times the depth.

7. The method of claim 6 in which the at least one baffle extension has a height between 1.2 and 1.5 times the internal enclosure depth.

8. The method of 6 in which the width of the at least one baffle extension and baffle together is between 1.4 and 1.8 times the internal enclosure depth.

9. The method of claim 6 in which the at least one driver comprises two woofers and one tweeter, and in which the baffle and at least on baffle extension together have a combined width of 1.5 times the internal enclosure depth and a height of 1.333 times the depth.

10. The method of claim 6 further providing at least three drivers, and in which the baffle and at least one baffle extension together have a combined width of at least 1.5 times the depth.

11. A system for improving the sound quality of a speaker enclosure comprising:

an enclosure flaying a top, a left side, a right side, a front and a back;

at least one driver mounted on a baffle and forming portion of an enclosure of which the baffle forms the front;

a baffle extension comprising an acoustically reflective surface extending from the line of intersection of the baffle and at least one the left and right side, and being substantially co-planar with the baffle, in which the width of the baffle extension combined with the baffle is between 1.4 and 1.6 times an internal depth of the enclosure.

12. The system of claim 11 in which the drivers comprise a woofer and a tweeter, and where the width of the baffle extensions combined with the baffle is at least 1.5 times an internal depth of the enclosure.

13. The system of claim 11 in which the at least one driver comprises two woofers and a tweeter, and the width of the baffle extensions combined with the baffle is at least 1.5 times an internal depth of the enclosure, and the height is between 1.2 and 1.4 times the internal depth.

* * * * *